(12) United States Patent
Palone

(10) Patent No.: US 9,193,198 B2
(45) Date of Patent: *Nov. 24, 2015

(54) PDMS IMPRINTING STAMP WITH EMBEDDED FLEXURE

(71) Applicant: Eastman Kodak Company, Rochester, NY (US)

(72) Inventor: Thomas W. Palone, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/181,909

(22) Filed: Feb. 17, 2014

(65) Prior Publication Data

US 2015/0231908 A1    Aug. 20, 2015

(51) Int. Cl.
| | |
|---|---|
| *B41K 3/00* | (2006.01) |
| *B82Y 30/00* | (2011.01) |
| *B29C 59/02* | (2006.01) |
| *G03F 7/00* | (2006.01) |
| *B82Y 10/00* | (2011.01) |
| *B29C 35/08* | (2006.01) |
| *B82Y 40/00* | (2011.01) |

(52) U.S. Cl.
CPC ............... *B41K 3/00* (2013.01); *B29C 35/0888* (2013.01); *B29C 59/026* (2013.01); *B82Y 10/00* (2013.01); *B82Y 30/00* (2013.01); *B82Y 40/00* (2013.01); *G03F 7/0002* (2013.01); *B29C 2059/023* (2013.01)

(58) Field of Classification Search
CPC .... G03G 7/0002; B41K 3/00; B29C 35/0888; B29C 59/02; B29C 59/026; B29C 2059/023
See application file for complete search history.

(56) References Cited

U.S. PATENT DOCUMENTS

| | | | |
|---|---|---|---|
| 5,669,303 A * | 9/1997 | Maracas et al. ............... | 101/327 |
| 6,916,584 B2 | 7/2005 | Sreenivasan et al. | |
| 7,157,036 B2 | 1/2007 | Choi et al. | |
| 7,704,425 B2 | 4/2010 | Heidari et al. | |
| 2002/0050220 A1* | 5/2002 | Schueller et al. ............ | 101/486 |
| 2010/0200146 A1* | 8/2010 | Zhu et al. ..................... | 156/62.2 |

OTHER PUBLICATIONS

Eric J. Wilhelm; Design of a Liquid Embossing Machine; Massachusetts Institute of Technology, Jun. 2001.

* cited by examiner

*Primary Examiner* — Blake A Tankersley
(74) *Attorney, Agent, or Firm* — Nelson A. Blish

(57) ABSTRACT

A non-deformable patterned template includes a stable mesh, wherein the stable mesh is resistant to deformation; a polymer sheet with the stable mesh embedded therein, wherein the polymer sheet is formed using a liquid polymer adapted to receive the stable mesh, and wherein the liquid polymer is cured after the stable mesh has been placed within the liquid polymer; and a surface pattern on at least one face of the polymer sheet.

3 Claims, 11 Drawing Sheets

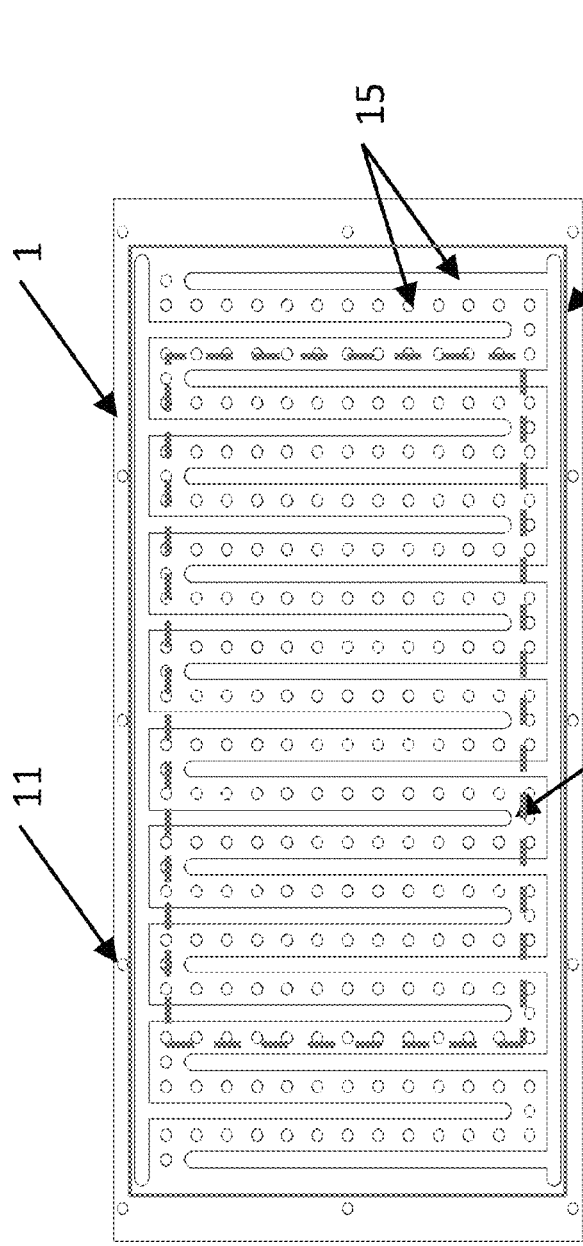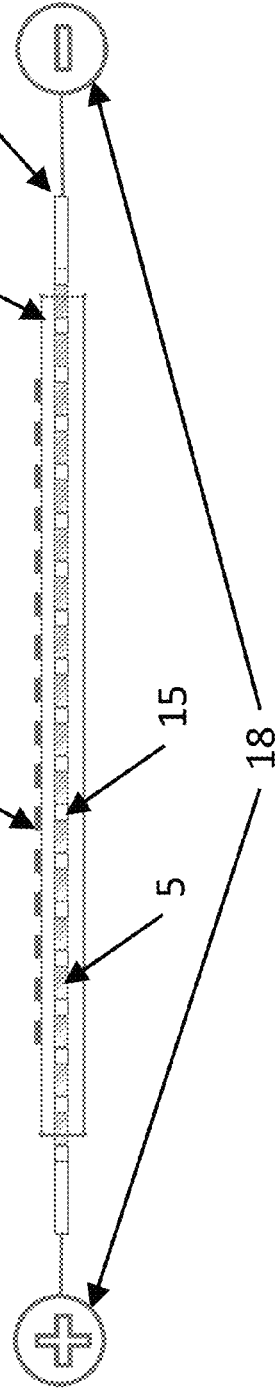

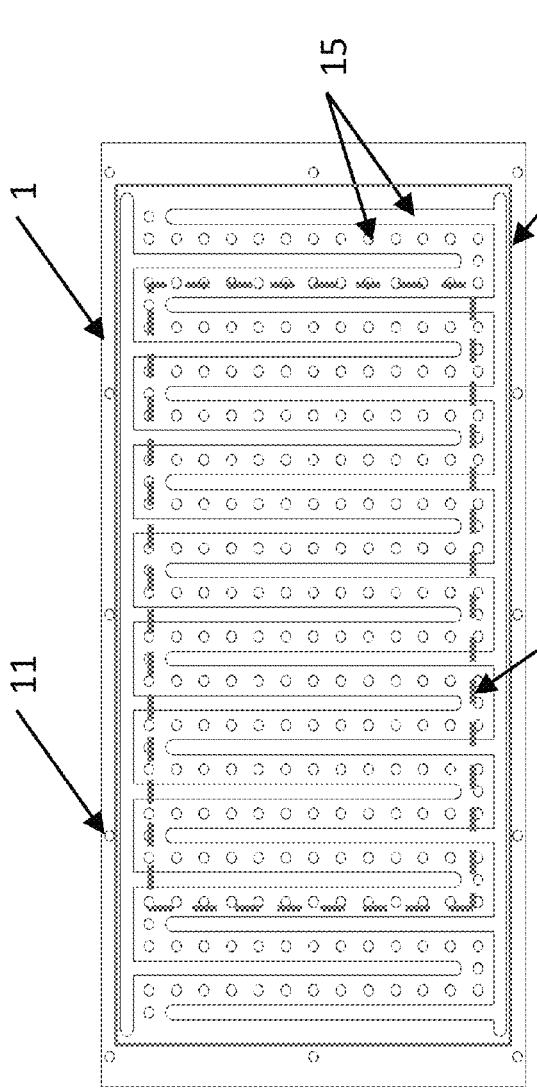
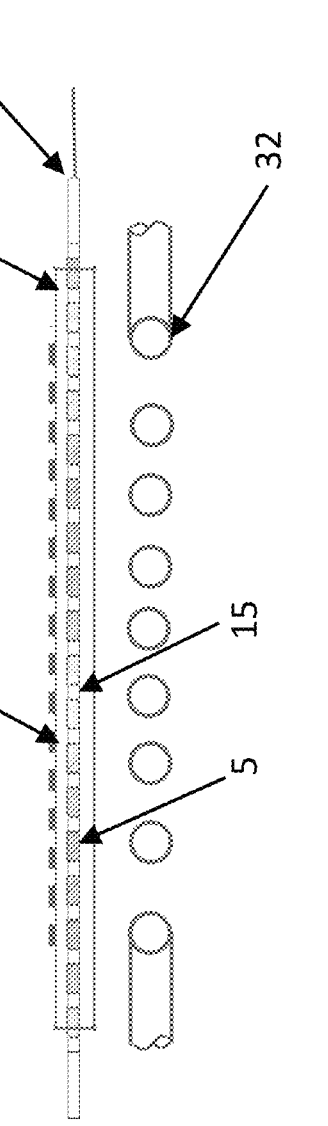
FIG. 5A
FIG. 5B
INDUCTION COIL HEATING

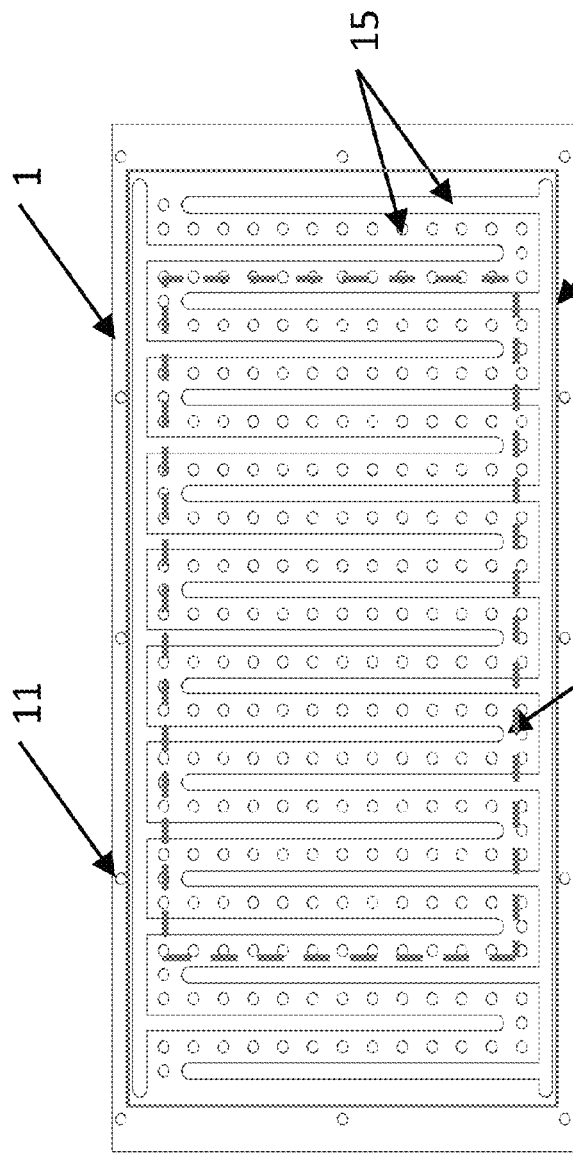
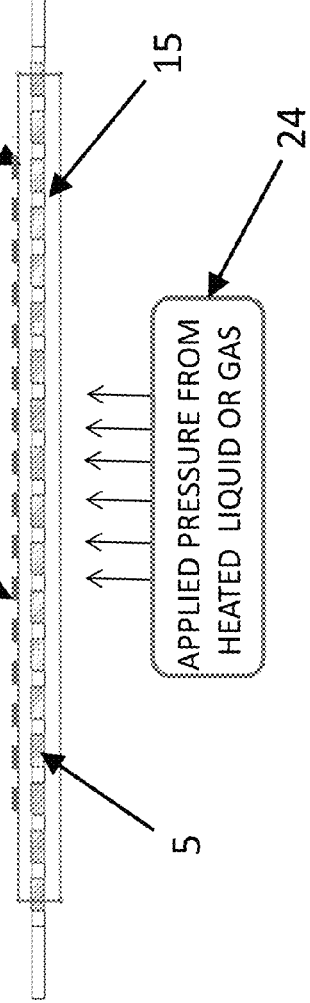
FIG. 6A
FIG. 6B

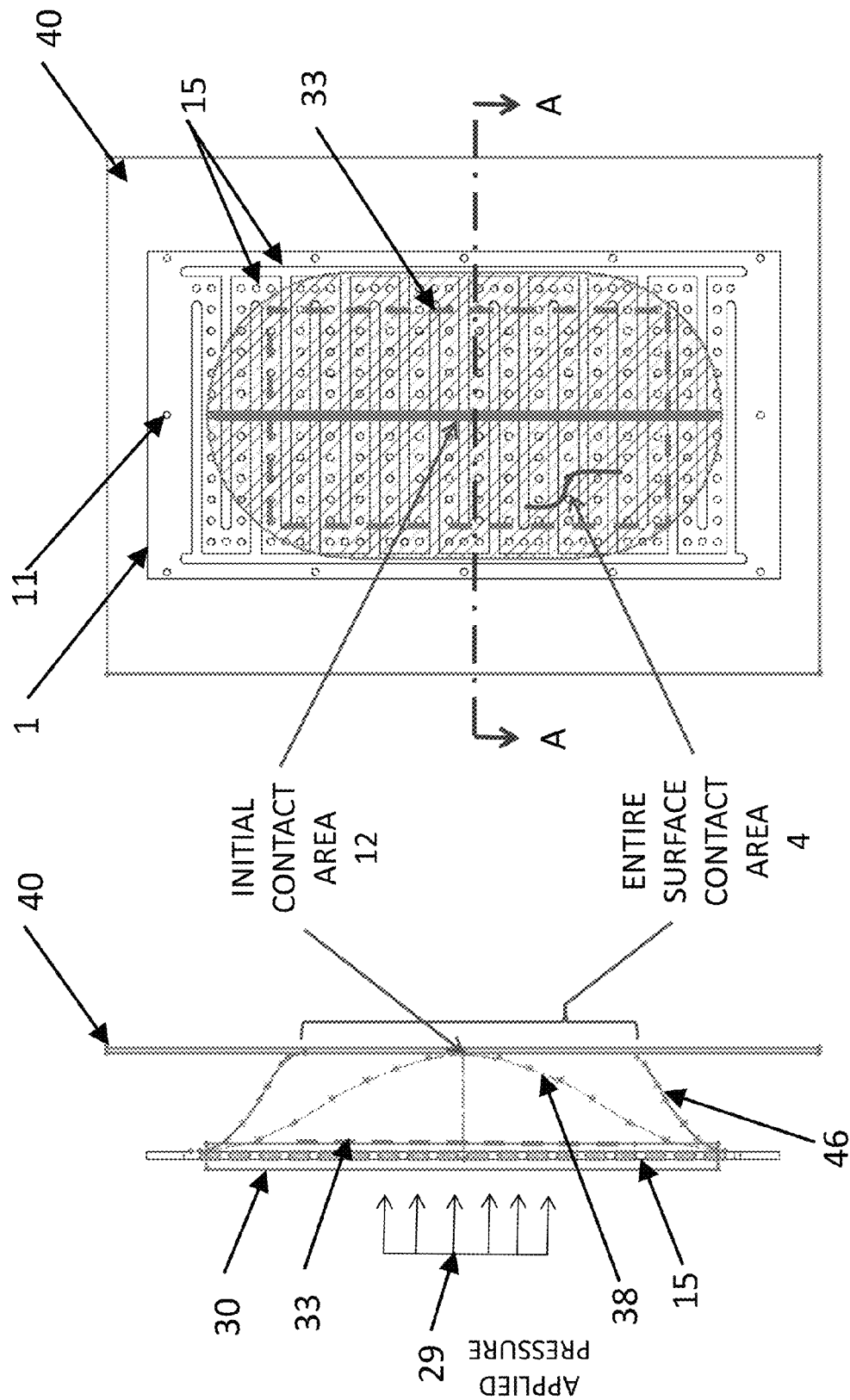

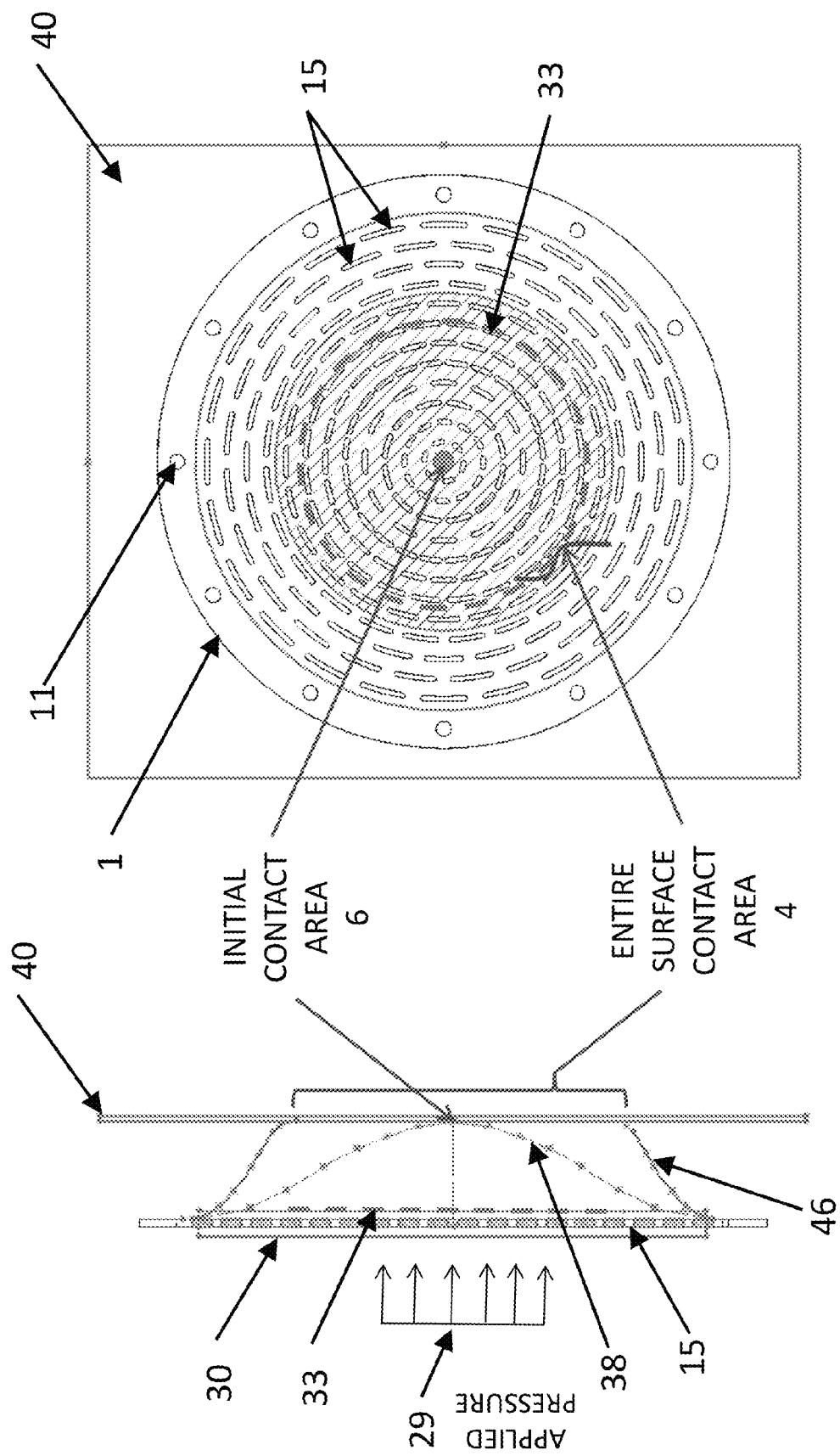

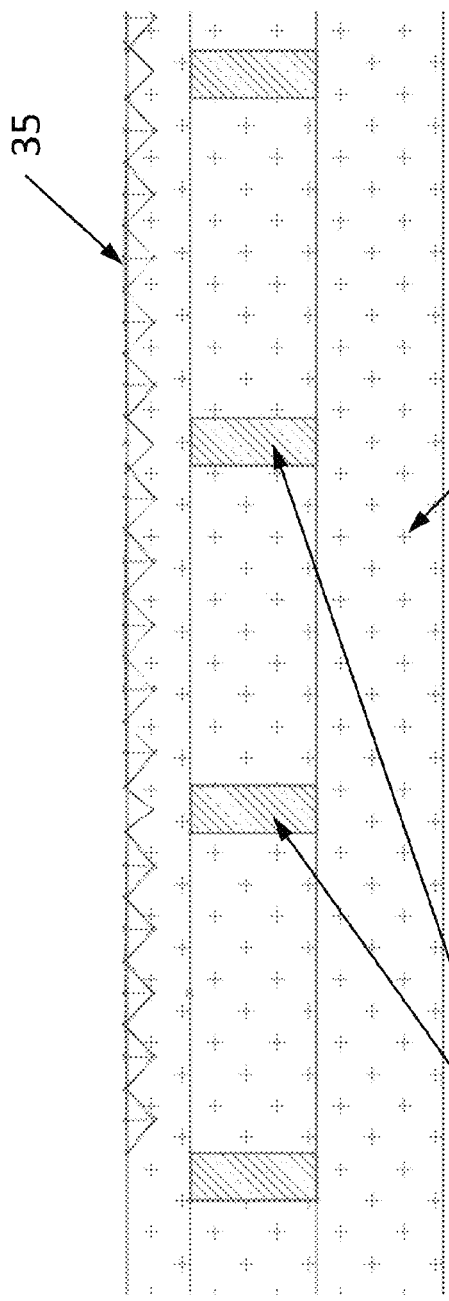
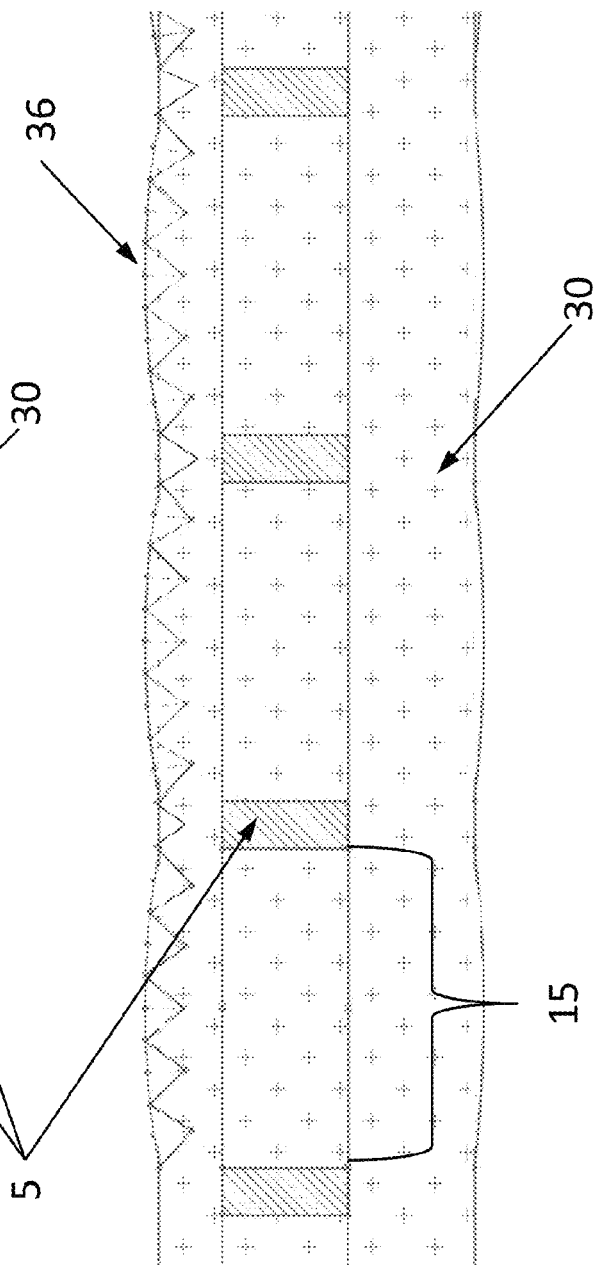
FIG. 10A
FIG. 10B

PDMS IMPRINTING STAMP WITH EMBEDDED FLEXURE

CROSS REFERENCE TO RELATED APPLICATIONS

Reference is made to commonly-assigned copending U.S. patent application Ser. No. 14/181,923, Feb. 17, 2014 herewith, entitled PDMS IMPRINTING STAMP WITH EMBEDDED FLEXURE, by Palone; U.S. patent application Ser. No. 14/085,006(now U.S. Publication No. 2015/0140156), filed Nov. 20, 2013, entitled NON-DEFORMABLE PATTERNED TEMPLATE, by Palone; and U.S. patent application Ser. No. 14/085,042(now U.S. Publication No. 2015/0140220), filed Nov. 20, 2013, entitled METHOD FOR FORMING A NON-DEFORMABLE PATTERNED TEMPLATE, by Palone; the disclosures of which are incorporated herein.

FIELD OF THE INVENTION

This invention relates in general to imprinting with a patterned elastomeric stamp and in particular to deforming the stamp to bring a portion of the stamp in contact with a surface to be stamped.

BACKGROUND OF THE INVENTION

Nanoimprint lithography is a method of fabricating nanometer scale patterns by mechanical deformation of imprint resist and subsequent processing. The imprint resist can be a thermally softened or photo-initiated liquid coating that is cured by heat or UV light during the imprinting. A template is brought into contact with the liquid coating and the liquid is cured. The cured liquid includes an imprint of any patterns formed in the template. Alignment of the template with the substrate is performed prior to curing the liquid as described in U.S. Pat. No. 6,916,584. Adhesion between the resist and the template must be controlled to allow proper release, see U.S. Pat. No. 7,157,036. The subject matter of both patents is incorporated herein.

A nano-pattern "parent" is produced using lithography on a silicon or glass parent. The parent pattern, sometimes called a positive image, is created using durable or environmentally stable materials, for example, a chrome positive created on glass. The pattern is then replicated on a liquid Polydimethylsiloxane (PDMS) layer, sometimes called a child layer or negative image. The PDMS is then cured and the final image is used as a template or stamp to reproduce the image on multiple products. The PDMS child pattern is then replicated onto another liquid layer, for example an epoxy-based negative photoresist (SU-8), re-creating the original positive image. SU-8 can be hardened using a combination of light and heat.

Despite the good properties of PDMS, there is a possibility of mechanical stress and thermal expansion causing errors in the moldable layer. As a result, U.S. Pat. No. 7,704,425 teaches performing all processing steps when using the stamp to transfer a pattern to a substrate at a constant control temperature, which is inconvenient in a manufacturing environment.

Wilhelm (Thesis, Mass. Institute of Technology, Jun. 2001) teaches casting the stamp around spring steel. As a result of the stresses, however, and under repeated bends, separation of the elastomer from the substrate or steel will occur resulting in waste and short life for the template. Wilhelm also identifies a significant problem with stamping using a flat fixed stamp with air bubbles. Air bubbles trapped between the stamp and the liquid substrate which receives the pattern transfer, prevents good contact between the stamp and substrate thereby resulting in pattern transfer defect. Wilhelm suggests a stiff bowed stamp as a solution. The bow in the stamp shape can help to push the air bubbles formed out from the center of the stamp. There is, however, a problem, there is too much contact force in the center of the stamp, where the stamp is at maximum height and poor pattern transfer at the edges of the stamp where the stamp is a minimum height. Wilhelm suggests the use of a thin flexible stamp to avoid the pattern transfer issues, but that results in wrinkles and poor pattern transfer.

What is needed is a reinforced elastomeric template or stamp. It must be resistant to mechanical stress and thermal expansion and have excellent durability. For UV curing during the pattern transfer process, the stamp must pass light even with the reinforcing substrate in place. Finally, the stamp must be able to take some curvature during its use to avoid the formation of bubbles and have a well controlled contact profile to avoid loss of quality due to failure to transfer the pattern in areas of excessive or insufficient contact.

SUMMARY OF THE INVENTION

Briefly, according to one aspect of the present invention a method for imprinting includes providing a polymer stamp having a surface pattern and an imbedded mesh, wherein the mesh is resistant to deformation in the x-direction and y-direction (lateral directions (width and length) of the mesh) and flexible in the z-direction (vertical direction); applying a force to the polymer stamp to deform the stamp and bring a portion of the stamp in contact with a surface to be stamped; and increasing the force to bring the entire surface pattern in contact with the surface to be stamped. The structure of the pattern of openings causes the mesh to function as a flexure such that, in one embodiment, the effect of the applied force is to create a linear contact pattern. In another embodiment, the pattern of openings is such that the effect of the force is to create a circular point contact pattern.

In other embodiments, the imbedded mesh can be heated to assist with pattern transfer and curing. The heat can be provided by heating the stamp by conductive heating. In another embodiment, the heat is applied by the force, wherein the force is comprised of a hot liquid or gas under pressure.

The structure of the pattern of openings that causes the mesh to function as a flexure can be concentric arc sections cross-hatch, hexagonal, diamond-shaped, circular, or oval.

The invention and its objects and advantages will become more apparent in the detailed description of the preferred embodiment presented below.

BRIEF DESCRIPTION OF THE DRAWINGS

FIGS. 4A and 4B show the stable mesh with resistive heating.

FIGS. 5A and 5B show the stable mesh with inductive heating.

FIGS. 6A and 6B show the stable mesh with contact heating.

FIGS. 8A and 8B show the flexure behavior when force is applied to the stable mesh with a linear flexure.

FIGS. 9A and 9B show the flexure behavior when force is applied to the stable mesh with a circular flexure.

FIGS. 10A and 10B show the stabilizing effect of the mesh on the PDMS stamp.

DETAILED DESCRIPTION OF THE INVENTION

The present invention will be directed in particular to elements forming part of, or in cooperation more directly with the apparatus in accordance with the present invention. It is to be understood that elements not specifically shown or described may take various forms well known to those skilled in the art.

A typical material used in nano-replication is polydimethylsiloxane (PDMS) although other materials may be suitable. The PDMS is typically degassed, then poured onto a precise lithography featured master or parent. These typically include silicon or chrome on glass masters. The PDMS stamp or child now contains the negative featured pattern of the master. Numerous low-cost PDMS child stamps can be replicated from the expensive parent master.

The resulting PDMS stamp is a low durometer polymeric sheet, which may be used as a mold or embossing stamp. The featured pattern is transferred from the PDMS stamp into a material that is thermally softened or photo-initiated, or a combination of both. The PDMS material properties are typical of an elastomer. Maintaining global registration and size with these elastomeric properties is difficult to automate in a manufacturing system. Combining a stable perforated material within the PDMS stamp's thickness results in a stamp that has the desirable properties of a polymer such as flexibility and negates the undesirable properties of a polymer such as poor dimensional stability.

The details on manufacturing a PDMS stamp with the stable mesh embedded therein is described in commonly-assigned copending U.S. patent application Ser. No. 14/085, 042, by Palone; the disclosure of which is incorporated herein. Briefly, the process starts with fabricating a stable mesh component with the desired patterned opening geometry, fiducials, and system mounting holes or features. The stable mesh component can be manufactured from most any material that exhibits superior stability compared to PDMS and similar polymers. To form the mesh stabilized stamp a lithographic mold is made that is adapted to constrain and register the master (parent) inverse pattern with the stable mesh component. The stable mesh and feature master are then inserted into the polymer mold.

The stable mesh is perforated with the desired frequency and pattern of openings which the PDMS envelops and locks the stamp to the stable mesh backbone. The manufacturing process is completed by heat or photo curing the polymer and removing the completed stamp assembly with the patterned features in polymer registered to fiducially in stable mesh support. Heating may include radiation, convective, conductive, or resistive heating.

Figure 1:
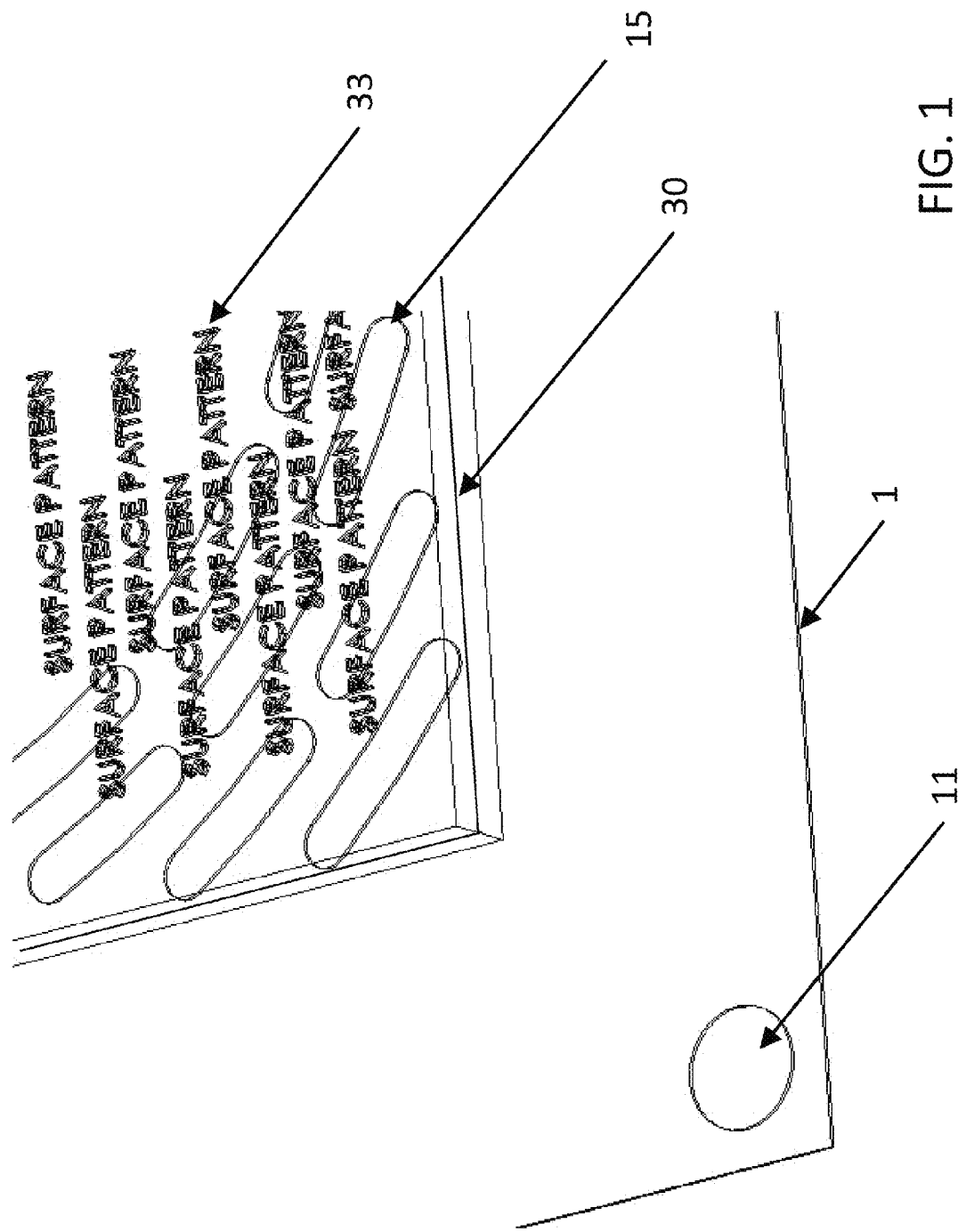
FIG. 1 shows the finished stamp with stable mesh and a surface pattern cast by the mold.

Referring now to FIG. 1, the finished stamp 30 is shown in a detail view after removal from the mold with the stable mesh 1 and a surface pattern 33 cast by the master parent. FIG. 1 also shows a locating feature, e.g. one of the mounting holes 11 on the sides of the stable mesh that can be used with a post or a clamping feature such as a bolt going through the hole to precise register the stamp when it is used to transfer patterns to a substrate.

Figure 2:
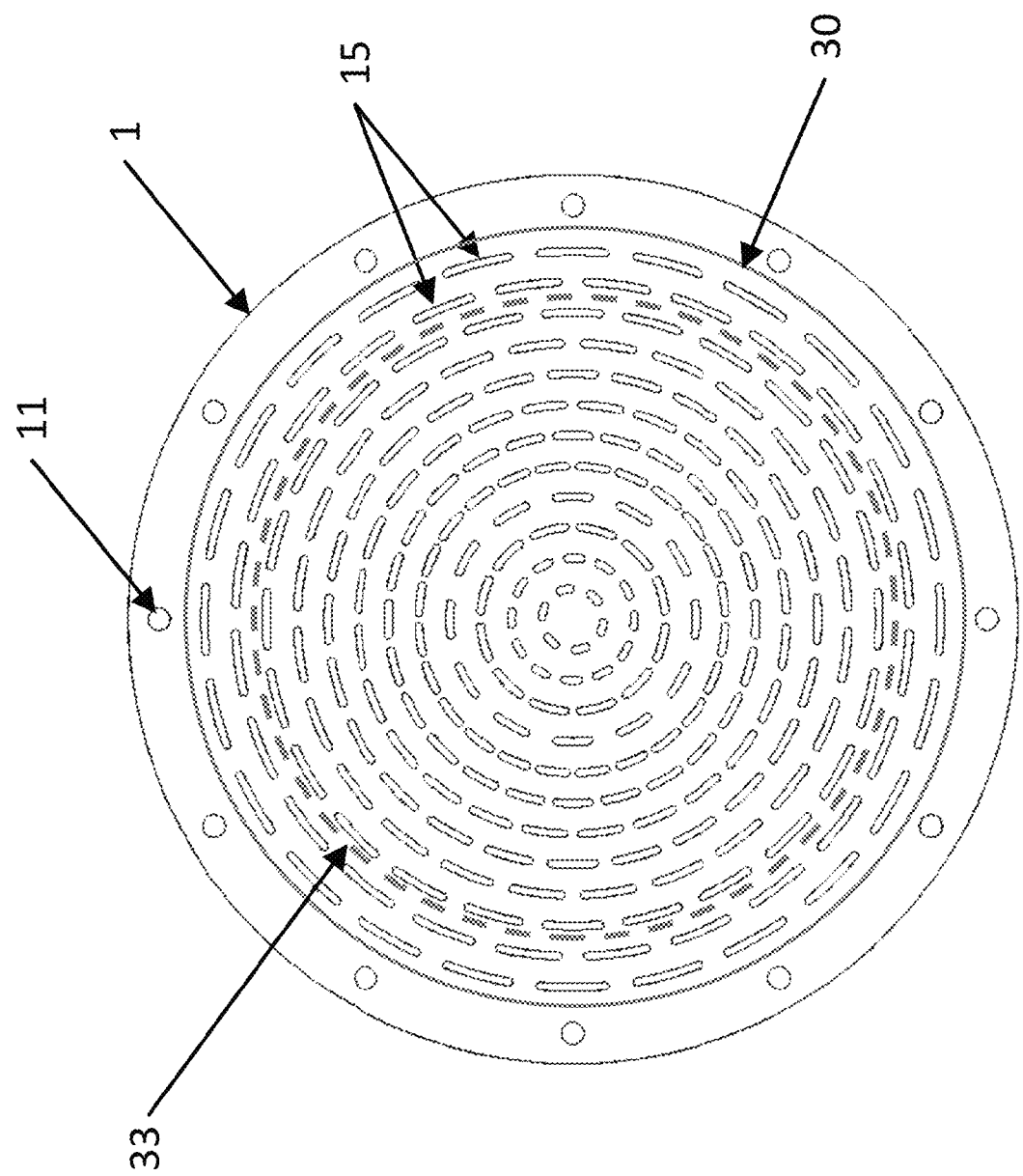
FIG. 2 shows the stable mesh in a circular flexure embodiment.

FIG. 2 shows a plan view of stable mesh 1 in a circular flexure embodiment. The concentric location of the stamp 30 is also shown. Around the edge of the stamp beyond the pattern of openings is the locating features 11. The openings, in this case concentric arc sections 15, are shown throughout the stable mesh inside the mounting portion and provide the desired circular flexure properties to movement of the stable mesh in the z-direction. The concentric arc sections also provide openings to pass actinic light as will be discussed below.

Figure 3:
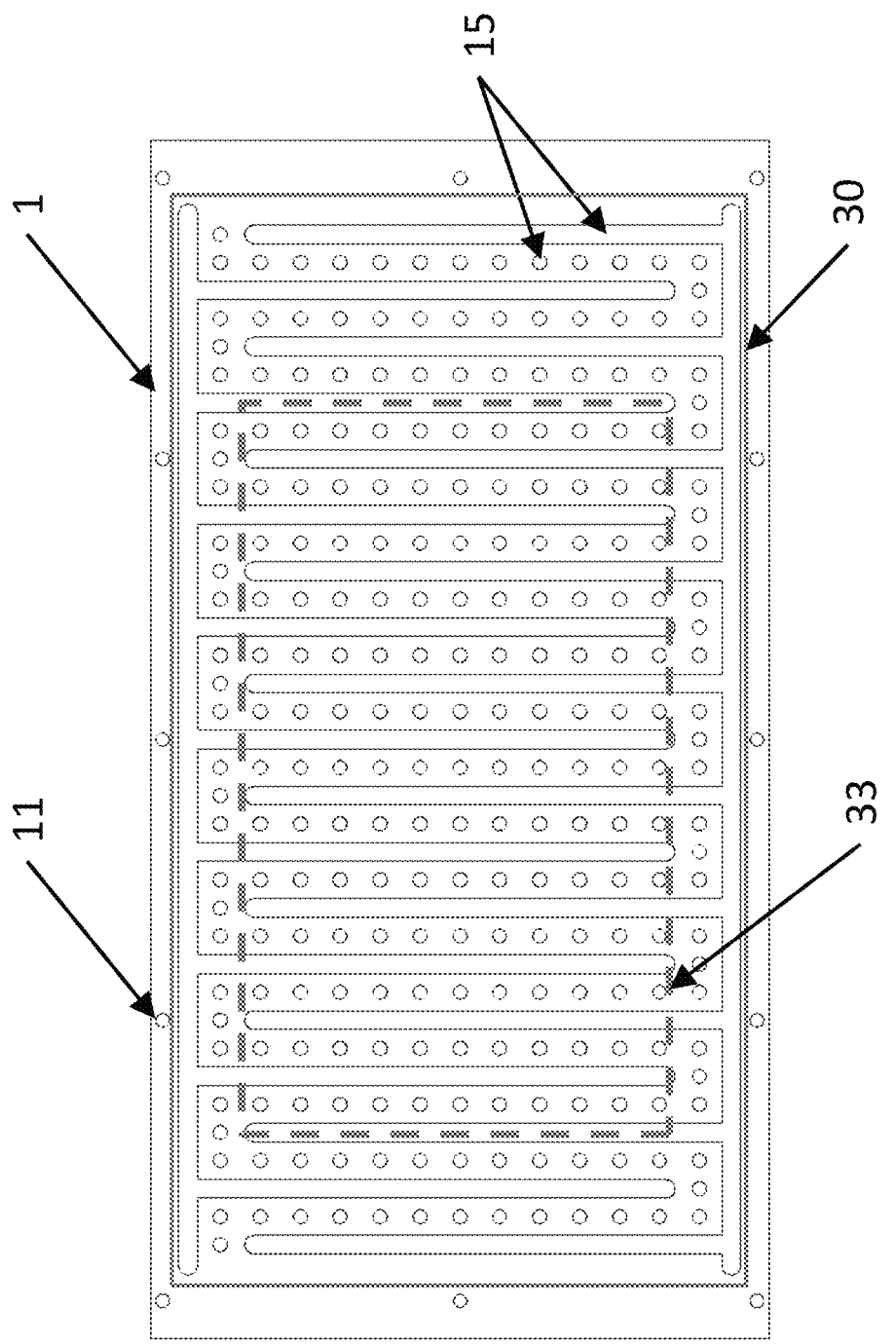
FIG. 3 shows the stable mesh in a linear flexure embodiment.

FIG. 3 shows a plan view of stable mesh 1 in a linear flexure embodiment. The central location of the stamp 30 is also shown. Around the edge of the stamp beyond the pattern of openings is the locating features 11. The openings, in this case a pattern of linear opening 15, are shown throughout the stable mesh inside the mounting portion and provide the desired linear flexure properties to movement of the stable mesh in the z-direction. Optionally, additional openings 15' can be provided in the flexure material to pass actinic light as will be discussed below.

During the operation of using the polymer stamp 30 to transfer a pattern to substrate as a mold or embossing stamp, the featured pattern is transferred from the stamp to a material that is thermally softened or photo-initiated, or a combination of both. Therefore, it is highly desirable to heat or warm the stamp to its operating temperature, which is usually above room temperature. It is also important to maintain the temperature in a controlled manner during curing of the material that is receiving the transferred pattern. FIGS. 4A and 4B show plan and side views of the stable mesh 1 with electrical connections 18 that will allow the user to pass a current though the metal structure of the stable mesh to resistively heat the stable mesh. Suitable sensors (not shown) and a control system (not shown) can be provided to maintain a constant temperature during operations, e.g. curing.

FIGS. 5A and 5B show plan and side views of the stable mesh 1 with an alternate embodiment for heating. An induction coil is provided to stimulate eddy currents in the metal material of the stable mesh. As is well known, these currents will result in heat generated in the mesh. Suitable sensors (not shown) and a control system (not shown) can be provided to maintain a constant temperature during operations, e.g. curing.

FIGS. 6A and 6B show plan and side views of the stable mesh 1 with an alternate embodiment for heating. It is a common practice to apply pressure to pattern transfer mesh for pattern transfer by a piston or bladder that itself can be heated using heated liquid or gas 24. The contact with pressure by a hot surface will cause contact heating to occur in the stable mesh. In this case, the use of a constant temperature fluid or can be provided to maintain a constant temperature during operations, e.g. curing.

Figure 7:
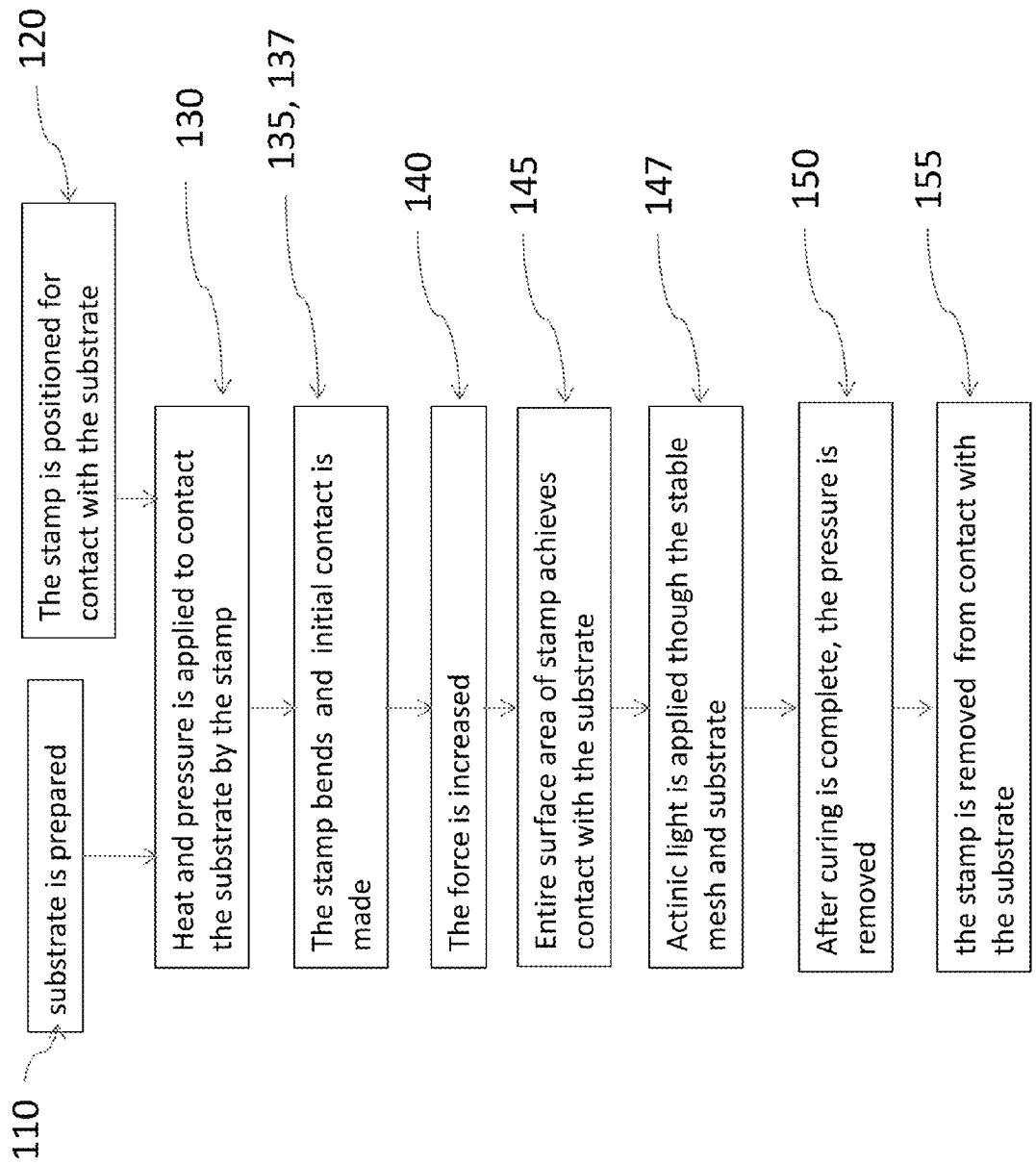
FIG. 7 shows the replication process flow diagram.

FIG. 7 describes the operation of the stamp for pattern transfer. The substrate is prepared 110 to receive the pattern, for example by spin coating a curable liquid polymer on the substrate. The stamp is positioned 120 for contact with the substrate. The system is heated and pressure applied 130 to contact the substrate by the stamp. The stamp bends 135 as proscribed by the flexure design on the stable mesh and initial contact 137 is made. The force is increased 140 causing the stamp to further move into contact with the substrate without excessive increase in the pressure or engagement of the stamp with the substrate in the region of initial contact. As this happens bubbles are eliminated or prevented in the contact region. Finally, the entire surface area achieves contact 145 with the substrate and the system is held at a constant temperature for curing. Actinic light is applied 147 though the stable mesh and substrate to assist with curing if needed. After curing is complete, the pressure is removed 150 and the stamp is removed 155 from contact with the substrate leaving behind an inverse pattern on the surface of the substrate.

FIGS. 8A and 8B illustrates the action of steps 130-145 when applied to a stamp with an imbedded linear flexure stable mesh in plan and perspective view. FIG. 8A is the plan view with the initial linear contact area 12 and the fully formed contact area 4 indicated. FIG. 8B shows the perspective view at position A-A from FIG. 8A. FIG. 8B shows the initial linear contact region 12 and the shape of the stamp 38 that results from the initial application of pressure 130, 29 through the linear flexure 15. The increased force 140 results in the stamp shape 46 and the flexure controlled contact of the stamp surface contact area 4 with the substrate.

FIGS. 9A and 9B illustrate steps 130-145 when applied to a stamp with an imbedded circular flexure stable mesh in plan and perspective view. FIG. 9A is the plan view with the initial point contact area 6 and the fully formed contact area 4 indicated. FIG. 9B shows the perspective view resulting from a perspective that goes though the center of the circular mesh. FIG. 9B shows the initial linear contact region 6 and the shape of the stamp 38 that results from the initial application of pressure 130, 29 through the circular flexure opening 15. The increased force 140 results in the stamp shape 46 and the flexure controlled contact of the stamp surface contact area 4 with the substrate.

Referring now to FIGS. 10A and 10B, the stabilizing effect of the mesh on the PDMS stamp will now be shown. The stable mesh is strongly resistant to deformation due to changes in temperature or moisture content of the stamp in response to environment or applied heat including radiation, convective, conductive, or resistive heating. Here, deformation refers specifically to changes in dimension or strains in the lateral directions (width and length) of the mesh (x-direction and y-direction). The post structures 5 between the holes of the stable mesh act to constrain and stabilize the polymer material, PDMS for example, of the stamp, also in the lateral directions (width and length). FIGS. 10A and 10B shows how the stamp 30 looks in an extreme close-up view where induced strains are greatly exaggerated for this discussion. In FIG. 10A the stamp is in a unstressed state where the temperature of the stamp is close to room temperature and the polymer is flat and straight as shown for the surface pattern surface 35. When the stamp, including the polymer and the stable mesh, is heated up, for example, in response to applied radiation, the polymer with a relative large CTE will attempt to expand. The resulting strain is constrained by the stable mesh structures and only very small deviations, such as the dilated surface structure 36 as shown in FIG. 10B will occur above the stable mesh openings 15. The relatively small openings will greatly limit the maximum extent of the strain of the polymer surface.

Figure 11:
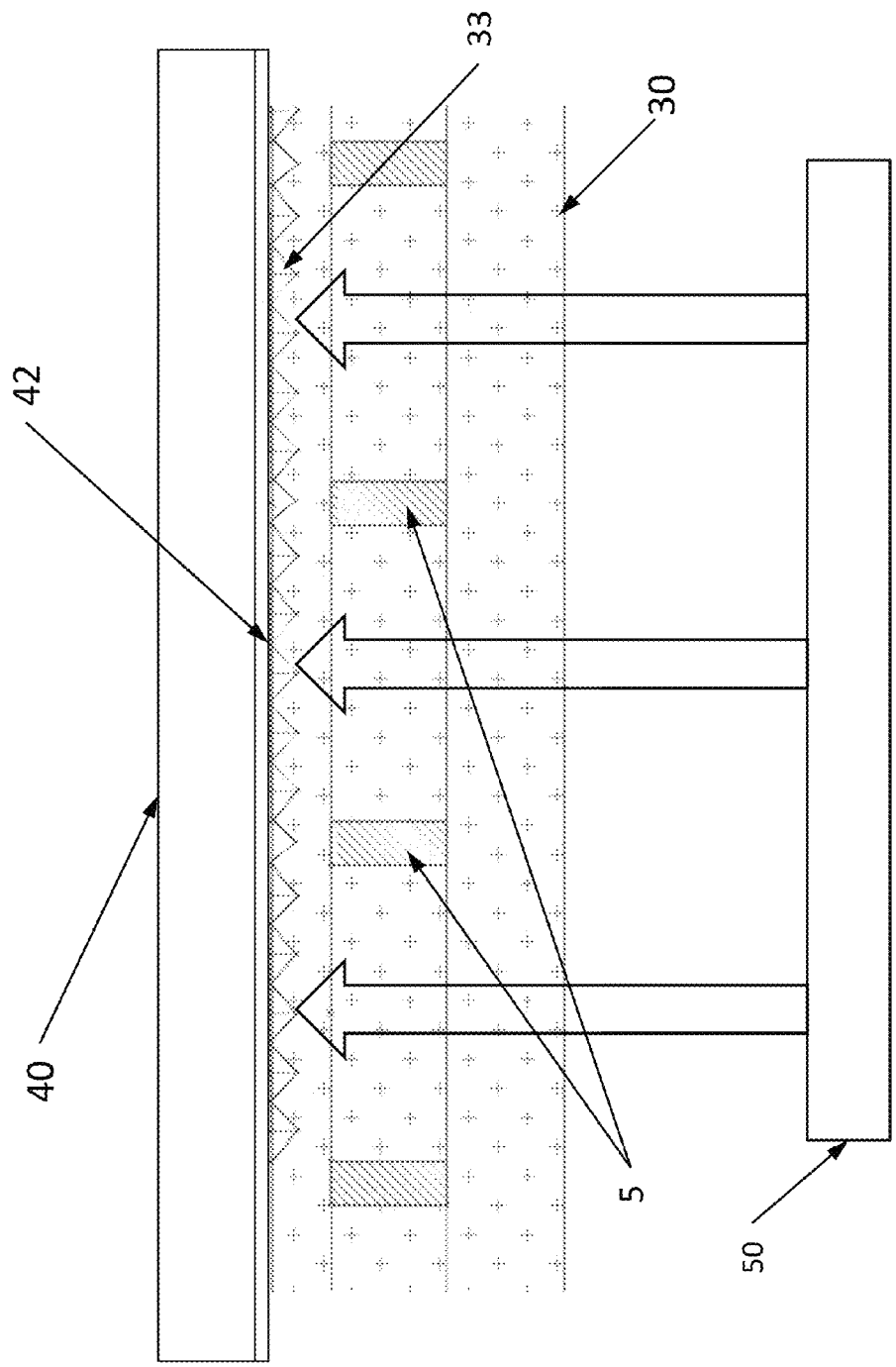
FIG. 11 shows the Actinic light is applied through the stable mesh and substrate.

FIG. 11 illustrates the action of steps 145-155 when applied to a stamp with an imbedded linear flexure stable mesh in perspective view. The entire surface area achieves contact 145 with the substrate and the system is held at a constant temperature for curing. The polymeric stamp 30 is shown in contact with a receiver substrate 40 which has a thermally softened or photo-initiated liquid coating 42 configured to receive the pattern transfer from the stamp. The surface pattern 33 is transferred to the receiver substrate by the application of pressure. Actinic light is applied 147 though the stable mesh and substrate to assist with curing if needed. The receiver substrate 40 is cured while the stamp is in contact by, for example, the application of actinic light from a light source 50. As shown, the actinic light can pass through the openings in the stabilizing mesh. The mesh is transparent to allow actinic radiation. The ability to cure in place is an important advantage of the stable mesh and allows for the formation of high relief structures by stamping without suffering from reflow. After curing is complete, the pressure is removed 150 and the stamp is removed 155 from contact with the substrate leaving behind an inverse pattern on the surface of the substrate.

As shown, the actinic light can pass through the openings in the stabilizing flexural mesh. The ability to cure in place is an important advantage of the stable flexural mesh and allows for the formation of high relief structures by stamping without suffering from reflow.

The following are additional feature that are not yet claimed: the stable mesh may contain mounting holes for mounting and/or tension; the perforated openings geometries are unlimited, depending on intended function; the perforated opening can vary within the stable mesh, such as the tiled smaller high-density configurations within the macro perforated sheet; the stable mesh openings may consist of geometry patterns, resulting in a defined flexural movement of the stable mesh backbone; combining this with the elastomeric properties of the PDMS, the combination may be used as a pneumatic piston to actuate the stamp, while maintaining spatial accuracy of the embossed pattern; when embossing or molding a photo curable polymer, a minimum open area is required to achieve the proper dose of radiation to cure the embossed substrate; when the stable mesh is made of a metal or reflectively coated plastic, once the radiation passes through the plurality of opening, the reflective surface may aid in cross-linking the polymer by total internal reflection.

It is conceivable to have multiple discrete polymer stamps molded onto the stable mesh backbone, where the solid backbone areas in between the stamp regions block the radiation from hitting the substrate.

The invention has been described in detail with particular reference to certain preferred embodiments thereof, but it will be understood that variations and modifications can be effected within the scope of the invention.

PARTS LIST 1 stable mesh
4 contact area
5 structures
6 contact area
11 mounting holes
12 initial linear contact area
15 opening
15' opening
18 electrical connections
24 applied pressure
29 applied pressure
30 finished stamp
33 surface pattern
35 surface pattern surface
36 dilated surface structure
38 stamp
40 receiver substrate
42 photo-initiated liquid coating
46 stamp shape
50 light source
110 substrate prepared
120 stamp positioned
130 heat and pressure applied
135 stamp bends
137 initial contact made

140 force increased
145 surface area achieves contact
147 actinic light applied
150 pressure removed
155 stamp removed

The invention claimed is:

1. A method for imprinting comprising:
providing a polymer stamp having a surface pattern and an imbedded mesh, wherein the mesh is resistant to deformation in the x-direction and y-direction and flexible in the z-direction;
applying a force to the polymer stamp to deform the stamp and bring a portion of the stamp in contact with a surface to be stamped; and
increasing the force to bring the entire surface pattern in contact with the surface to be stamped;
wherein a structure of a pattern of openings causes the mesh to function as a flexure; and
wherein the pattern of openings are concentric arc sections.

2. The method of claim 1, wherein the force applied creates a circular contact pattern.

3. The method of claim 1 further comprising:
heating the mesh.

* * * * *